(12) United States Patent
Lee

(10) Patent No.: US 12,362,214 B2
(45) Date of Patent: Jul. 15, 2025

(54) OHT VEHICLE AND METHOD OF CONTROLLING OPERATION OF SAME

(71) Applicant: SEMES CO., LTD., Cheonan-si (KR)

(72) Inventor: Sung Hyun Lee, Anyang-si (KR)

(73) Assignee: SEMES CO., LTD., Cheonan-si (KR)

( * ) Notice: Subject to any disclaimer, the term of this patent is extended or adjusted under 35 U.S.C. 154(b) by 637 days.

(21) Appl. No.: 17/750,364

(22) Filed: May 22, 2022

(65) Prior Publication Data

US 2023/0159306 A1      May 25, 2023

(30) Foreign Application Priority Data

Nov. 24, 2021   (KR) ........................ 10-2021-0163665

(51) Int. Cl.
| | | |
|---|---|---|
| H01L 21/677 | (2006.01) | |
| B65G 1/04 | (2006.01) | |
| B66C 17/04 | (2006.01) | |
| H01L 21/67 | (2006.01) | |
| H01L 21/68 | (2006.01) | |

(52) U.S. Cl.
CPC ...... *H01L 21/67733* (2013.01); *B65G 1/0457* (2013.01); *H01L 21/67288* (2013.01); *H01L 21/6773* (2013.01); *H01L 21/67736* (2013.01); *H01L 21/67775* (2013.01); *H01L 21/68* (2013.01); *B66C 17/04* (2013.01)

(58) Field of Classification Search
CPC ......... H01L 21/67733; H01L 21/67775; H01L 21/67288; H01L 21/68; H01L 21/6773; H01L 21/67736; H01L 21/681; B65G 1/0457; B65G 2201/0297; B66C 17/04; B66C 1/16; B66C 11/00; B66C 13/08; B66C 13/46

See application file for complete search history.

(56) References Cited

U.S. PATENT DOCUMENTS

| | | | |
|---|---|---|---|
| 2012/0128452 A1* | 5/2012 | Murata | ............. H01L 21/67379 414/222.01 |
| 2023/0065660 A1* | 3/2023 | Shen | ................. H01L 21/67769 |

FOREIGN PATENT DOCUMENTS

| | | | | |
|---|---|---|---|---|
| JP | 09-301680 | 11/1997 | | |
| JP | WO-2012043110 A1 * | 4/2012 | ............. | H01L 21/67 |
| JP | WO-2015166738 A1 * | 11/2015 | ............... | B65G 1/04 |
| JP | 2016-047747 | 4/2016 | | |

OTHER PUBLICATIONS

Office Action from the Korean Intellectual Property Office dated Apr. 3, 2023.

* cited by examiner

*Primary Examiner* — Thomas Randazzo

(57) ABSTRACT

Proposed are an OHT vehicle and a method of controlling the operation of the same. More particularly, proposed is a technology in which when a hand unit of an OHT vehicle loads a transfer container and unloads the same to a destination load port, an error between a recess of the transfer container and a positioning pin of the load port caused by the tilt of the transfer container is resolved through position correction of the hand unit, thereby enabling the transfer container to be accurately placed on the load port.

20 Claims, 16 Drawing Sheets

OHT VEHICLE AND METHOD OF CONTROLLING OPERATION OF SAME

CROSS REFERENCE TO RELATED APPLICATION

The present application claims priority to Korean Patent Application No. 10-2021-0163665, filed Nov. 24, 20121, the entire contents of which is incorporated by reference herein for all purposes.

BACKGROUND OF THE INVENTION

Field of the Invention

The present disclosure relates generally to an OHT vehicle and a method of controlling the operation of the same. More particularly, the present disclosure relates to a technology in which when a hand unit of an OHT vehicle loads a transfer container and unloads the same to a destination load port, an error between a recess of the transfer container and a positioning pin of the load port caused by the tilt of the transfer container is resolved through position correction of the hand unit, thereby enabling the transfer container to be accurately placed on the load port.

Description of the Related Art

In semiconductor manufacturing, a variety of numerous processes are performed to yield the final product, and hundreds of thousands of cargo transfers occur in the process of performing the semiconductor manufacturing process. To prevent contamination and damage to semiconductor materials and delivery accidents during the cargo transfer process, an overhead hoist transfer (OHT) is utilized as an automated transfer system on the semiconductor manufacturing line.

An OHT vehicle holds and loads a transfer container, such as a front opening unified pod (FOUP) or front opening shipping box (FOSB), from an arbitrarily port and moves along a rail installed on the ceiling to unload the transfer container to a destination port.

The destination port may be provided with a load port on which the transfer container transferred by the OHT vehicle is placed. For example, a load port for supporting a general wafer cassette, a load port for supporting a FOUP, a load port for supporting a FOSB, a load port for supporting a magazine, a load port for supporting trays for storing semiconductor packages, etc. may be provided on the shelf of a side buffer device or an under buffer device.

The load port may be provided with a loading table on which the transferred transfer container is placed, and a positioning pin for determining a placement position of the transfer container may be provided on the loading table. In addition, a recess corresponding to the positioning pin provided on the loading table may be provided in a lower surface of the transfer container such as a FOUP, FOSB, etc.

In a case where the OHT vehicle unloads the transfer container on the loading table of the load port while the transfer container held by the OHT vehicle is tilted due to various factors, there is a problem in that the positioning pin of the loading table and the recess formed in the lower surface of the transfer container are misaligned, so that the transfer container cannot be placed in an appropriate position.

When the transfer container is placed in a misaligned position on the loading table, an error occurs in opening a door of the transfer container to unload wafers from the transfer container, causing a problem in the operation of the overall process.

Therefore, there is a need to unload the transfer container transferred by the OHT vehicle to a correct position on the loading table of the load port.

The foregoing is intended merely to aid in the understanding of the background of the present disclosure, and is not intended to mean that the present disclosure falls within the purview of the related art that is already known to those skilled in the art.

SUMMARY OF THE INVENTION

The present disclosure has been made keeping in mind the above problems occurring in the related art, and an objective of the present disclosure is to provide a method of accurately placing a transfer container on a loading table of a load port by determining the degree of tilt of the transfer container transferred by an OHT vehicle and correcting an unloading position of the transfer container.

An objective of the present disclosure is to solve the problem in which when a transfer container held by an OHT vehicle is unloaded in a tilted state, the transfer container cannot be placed in an appropriate position because a positioning pin of a loading table and a recess formed in a lower surface of the transfer container are misaligned.

Furthermore, an objective of the present disclosure is to solve the problem in which the position of a lower surface of a transfer container placed on a loading table of a load port cannot be determined because the degree of tilt of the transfer container is variously changed depending on situations.

The objectives of the present disclosure are not limited to the objectives mentioned above, and other objectives and advantages of the present disclosure which are not mentioned may be understood by the following description.

In order to accomplish the above objectives, according to an aspect of the present disclosure, there is provided a method of controlling operation of an OHT vehicle, the method including: a transferring step of loading a transfer container and moving the transfer container to a destination port; an error determining step of measuring a distance between a hand unit and the transfer container and determining a degree of tilt of the transfer container on the basis of the distance value; a position correcting step of adjusting a position of the hand unit by moving the transfer container to a load port of the destination port where the transfer container is to be unloaded on the basis of the degree of tilt of the transfer container; and an unloading step of unloading the transfer container to the load port of the destination port.

As an example, the error determining step may include: a distance measuring step of measuring a front end distance between a front end of the hand unit and a front end of the transfer container; and a tilt determining step of determining the degree of tilt by comparing the front end distance value with a reference value.

Here, the tilt determining step may be performed by calculating a tilt angle according to a ratio between the front end distance value and the reference value.

As an example, the error determining step may include: a distance measuring step of measuring a rear end distance value between a rear end of the hand unit and a rear end of the transfer container; and a tilt determining step of determining the degree of tilt by comparing the rear end distance value with a reference value.

Here, the tilt determining step may be performed by calculating a tilt angle according to a ratio between the rear end distance value and the reference value.

As an example, the error determining step may include: a distance measuring step of measuring a front end distance value between a front end of the hand unit and a front end of the transfer container and a rear end distance value between a rear end of the hand unit and a rear end of the transfer container; and a tilt determining step of determining the degree of tilt by comparing the front end distance value with the rear end distance value.

Here, the tilt determining step may be performed by calculating a tilt angle according to a ratio between the front end distance value and the rear end distance value.

As an example, the error determining step may include: a recess position determining step of determining a position of a recess of the transfer container on the basis of the degree of tilt of the transfer container; and an error distance calculating step of calculating an error distance between the calculated position of the recess and a normal position.

As an example, the error distance calculating step may be performed by calculating an error distance between a downward vertical extension line for the determined position of the recess and a positioning pin provided on the load port of the destination port as a correction distance.

Furthermore, the position correcting step may be performed by moving the transfer container to the load port of the destination port where the transfer container is to be unloaded on the basis of the degree of tilt of the transfer container and moving the hand unit through a slide unit.

As an example, the position correcting step may be performed by horizontally moving the hand unit by the correction distance through a slide unit.

According to an aspect of the present disclosure, there is provided an OHT vehicle including: a transfer module configured to be movable along a rail; a hoist module including a hand unit configured to hold a transfer container, a hoist unit configured to move the hand unit in a vertical direction, and a slide unit configured to move the hand unit in a horizontal direction; a displacement measuring means mounted on the hand unit and configured to measure a distance between the hand unit and the transfer container held by the hand unit; and a controller configured to adjust a position of the hand unit by determining a degree of tilt of the held transfer container on the basis of the distance value between the hand unit and the transfer container.

As an example, the displacement measuring means may include a distance measuring sensor disposed at one of a front end of the hand unit and a rear end of the hand unit and configured to measure a distance between one of the front end of the hand unit and the rear end of the hand unit and a corresponding one of a front end of the transfer container and a rear end of the transfer container.

As an example, the displacement measuring means may include: a front end distance measuring sensor disposed at a front end of the hand unit and configured to measure a distance between the front end of the hand unit and a front end of the transfer container; and a rear end distance measuring sensor disposed at a rear end of the hand unit and configured to measure a distance between the rear end of the hand unit and a rear end of the transfer container.

As an example, the controller may include: an error determining part configured to calculate an error distance according to a recess position by determining the degree of tilt of the held transfer container on the basis of the distance value between the hand unit and the transfer container and by determining a position of a recess of the transfer container on the basis of the degree of tilt of the transfer container; and a position correcting part configured to adjust the position of the hand unit on the basis of the error distance.

As an example, the error determining part may calculate a tilt angle by comparing a front end distance value between a front end of the hand unit and a front end of the transfer container or a rear end distance value between a rear end of the hand unit and a rear end of the conveying container with a reference value, and determine the position of the recess of the transfer container on the basis of the tilt angle.

As an example, the error determining part may calculate an error distance between a downward vertical extension line for the determined position of the recess and a positioning pin provided on a load port of a destination port as a correction distance.

As an example, the position correcting part may control the slide unit to horizontally move the hand unit by the correction distance.

As an example, the controller may correct the position of the hand unit through the position correcting part and then controls the hoist unit to lower the hand unit and unload the transfer container so that the recess of the transfer container corresponds to a positioning pin provided on a load port of a destination port.

According to an aspect of the present disclosure, there is provided a method of controlling operation of an OHT vehicle, the method including: a transferring step of loading a transfer container and moving the transfer container to a destination port; a distance measuring step of measuring a distance between at least one of a front end and a rear end of a hand unit and at least one of a front end and a rear end of the transfer container; a tilt determining step of calculating a tilt angle according to a degree of tilt of the transfer container by comparing a front end distance value or a rear end distance value with a reference value or by comparing the front end distance value with the rear end distance value; a recess position determining step of determining a position of a recess of the transfer container on the basis of the degree of tilt; and an error distance calculating step of calculating an error distance between a downward vertical extension line for the determined position of the recess and a positioning pin provided on a load port of the destination port as a correction distance; a position correcting step of horizontally moving the hand unit by the correction distance through a slide unit; and an unloading step of lowering the hand unit through a hoist unit and unloading the transfer container to the load port of the destination port.

According to the present disclosure as described above, it is possible to accurately place the transfer container on the loading table of the load port by determining the degree of tilt of the transfer container transferred by the OHT vehicle and correcting the unloading position of the transfer container.

In particular, it is possible to solve the problem in which when the transfer container held by the OHT vehicle is unloaded in a tilted state, the transfer container cannot be placed in an appropriate position because the positioning pin of the loading table and the recess formed in the lower surface of the transfer container are misaligned.

Furthermore, it is possible to solve the problem in which when the OHT vehicle unloads the transfer container in a tilted state to the loading table of the load port connected to substrate processing equipment, etc., a sealed state of an inner space of the substrate processing equipment is released because a container door and a port door cannot make close contact with each other, so that the overall semiconductor process cannot be performed properly.

The effects of the present disclosure are not limited to the effects mentioned above, and other effects not mentioned will be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, exemplary embodiments of the present disclosure will be described in detail with reference to the accompanying drawings, but the present disclosure is not limited or restricted by the described embodiments.

For a better understanding of the disclosure, its operating advantages and the specific objectives attained by its uses, reference is made to the descriptive matter in which the exemplary embodiments of the disclosure are illustrated.

The terminology used herein is for the purpose of describing particular embodiments only and is not intended to be limiting. As used herein, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

In the following description, detailed descriptions of known functions and components incorporated herein will be omitted when it may make the subject matter of the present disclosure unclear.

The present disclosure proposes a method in which when a hand unit of an OHT vehicle loads a transfer container and unloads the same to a destination load port, an error between a recess of the transfer container and a positioning pin of the load port caused by the tilt of the transfer container is resolved through position correction of the hand unit, thereby enabling the transfer container to be accurately placed on the load port.

Figure 1:
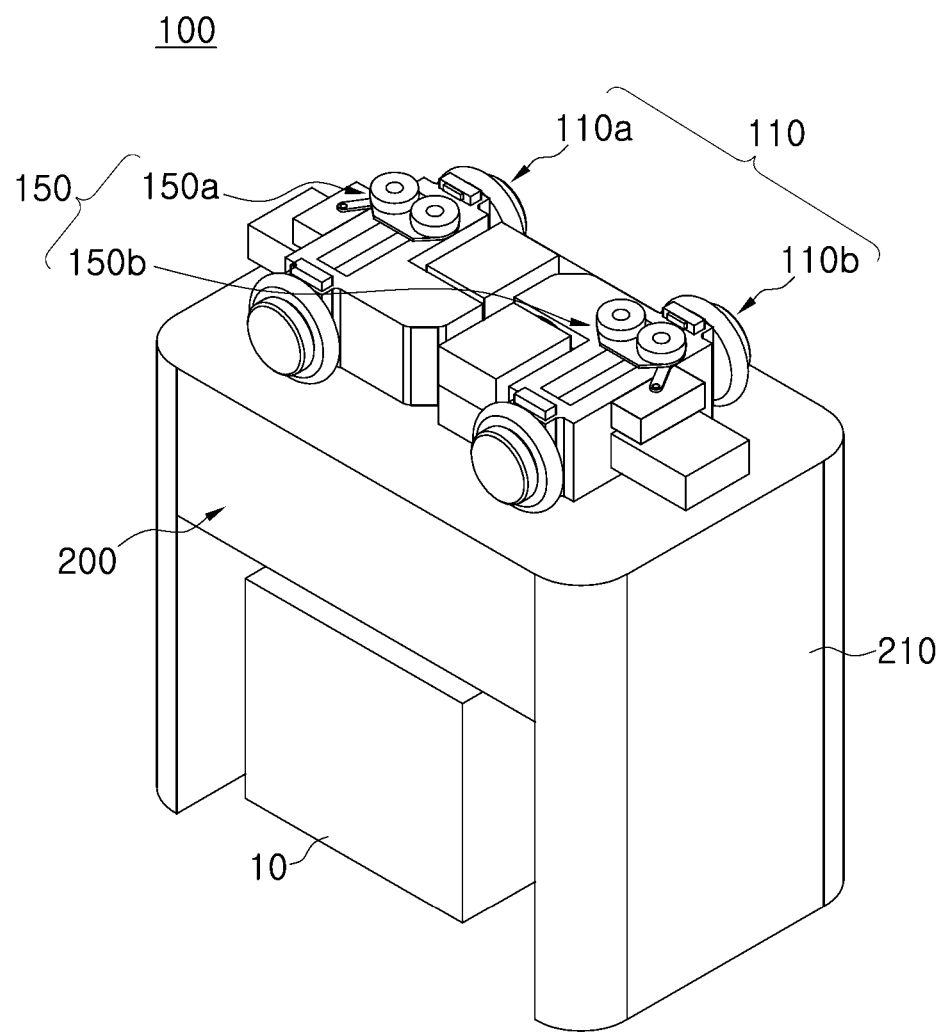
FIG. 1 illustrates an embodiment of an OHT vehicle 100 according to the present disclosure.

FIG. 1 illustrates an embodiment of an OHT vehicle 100 according to the present disclosure.

The OHT vehicle 100 may include a traveling module 110, a steering module 150, a hoist module 200, and a controller (not illustrated).

The OHT vehicle 100 may be traveled on a rail through the traveling module 110, and the traveling direction thereof may be changed through the steering module 150.

As an example, the OHT vehicle 100 may include a front end traveling unit 110a and a rear end traveling unit 110b, and a front end steering unit 150a and a rear end steering unit 150b may be disposed to correspond to the front end traveling unit 110a and the rear end traveling unit 110b, respectively.

The traveling module 110 and the steering module 150 may be variously modified, and various known technologies may be appropriately applied to the configuration and operation relationship of the traveling module 110 and the steering module 150.

The hoist module 200 may load and hold a transfer container 10 from a specific port, and unload the transfer container 10 upon reaching a destination port.

The controller (not illustrated) may control the operation of each configuration of the OHT vehicle 100. In particular, the controller may control the operation of the hoist module 200 to accurately unload the transfer container 10 to a corresponding position on a load port of the destination port through position correction. This technical feature of the present disclosure will be described later in detail with reference to an embodiment.

Figure 2A:
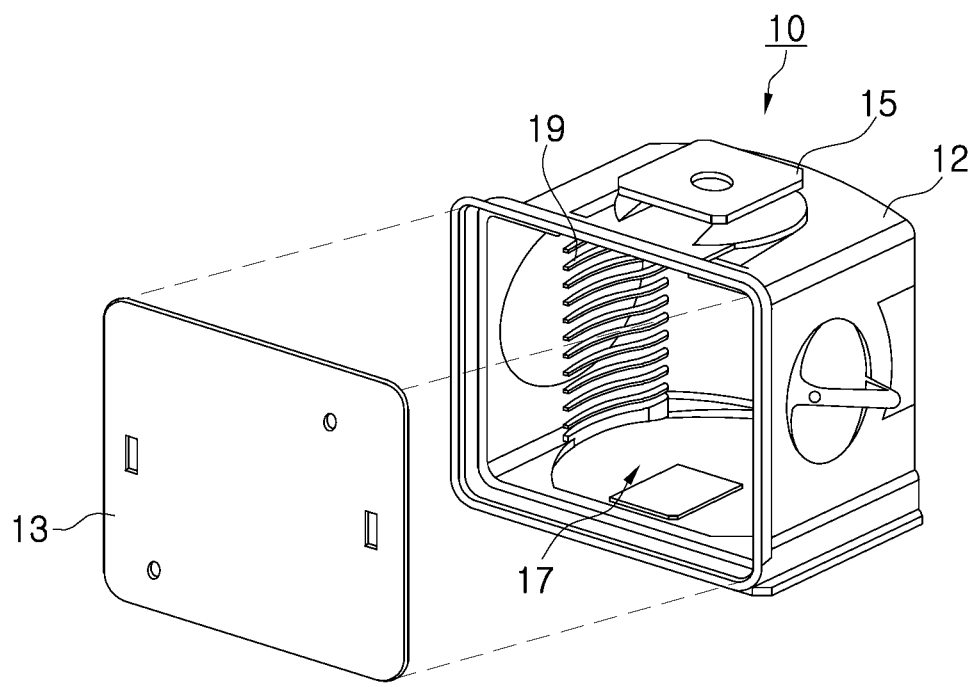
FIGS. 2A and 2B are views illustrating an embodiment of a transfer container transferred by the OHT vehicle according to the present disclosure.
Figure 2B:
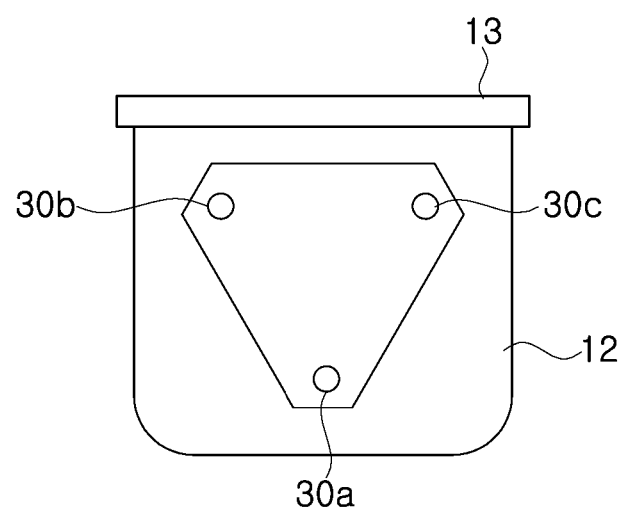

In regard to the transfer container 10 transferred by the OHT vehicle 100, FIGS. 2A and 2B illustrate an embodiment of a transfer container 10 transferred by the OHT vehicle 100 according to the present disclosure.

Although a front opening unified pod (FOUP) is described as an example as the transfer container 10, the present disclosure is not limited thereto and can be applied to transfer various transfer containers.

The size of wafers used in a semiconductor manufacturing process is standardized according to the Semiconductor Equipment and Materials International (SEMI) standard, and accordingly, the size of the transfer container 10 such as a front opening unified pod (FOUP) and front opening shipping box (FOSB) may also be standardized to correspond to the size of wafers to be transferred. Of course, the present disclosure can also be applied to a case of transferring a non-standardized transfer container.

The transfer container 10 includes a container body 12 and a container door 13. An inner space 17 is provided in the container body 12 to store objects such as wafers. As an example, a plurality of ribs 19 between which a plurality of wafers are sequentially inserted and stacked may be provided on a sidewall of the inner space 17 of the transfer container 10. The container body 12 may have a front side opened and closed by the container door 13.

A plurality of recesses 30a, 30b, and 30c may be provided in a lower surface of the container body 12. The plurality of recesses 30a, 30b, and 30c provided in the transfer container 10 may be formed to correspond to positioning pins provided on a loading table of the load port of the destination port. In other words, the recesses 30a, 30b, and 30c may be formed in the lower surface of the container body 12 to correspond to the arrangement position, number, size, etc. of the positioning pins provided on the loading table of the load port.

When the hoist module 200 of the OHT vehicle 100 unloads the transfer container 10 to the loading table of the load port of the destination port, the recesses 30a, 30b, and 30c formed in the lower surface of the container body 12 are engaged with the positioning pins on the loading table so as to allow the transfer container 10 to be placed on the loading table.

A flange 15 may be provided on an upper surface of the container body 12. The OHT vehicle 100 may transfer the transfer container 10 by holding the flange 15 of the transfer container 10 through the hoist module 200 of the OHT vehicle 100.

When the OHT vehicle 100 holds and transfers the transfer container 10, the transfer container 10 may be tilted due to various factors. For example, the container body 12 and the flange 15 of the transfer container 10 may be separately produced and assembled in such a manner that the flange 15 is coupled onto the container body 12.

Due to the assembly structure of the container body 12 and the flange 15, the container body 12 and the flange 15 may be disengaged from each other, resulting in tilt of the transfer container 10. In addition, the center of gravity of the container body 12 does not correspond to the center of gravity of the flange 15, so that the transfer container 10 may be tilted when the hoist module 200 of the OHT vehicle 100 holds the transfer container 10. In addition, the position of the center of gravity of the transfer container 10 is changed depending on the weight and quantity of the objects loaded in the transfer container 10, so that when the hoist module 200 of the OHT vehicle 100 holds the transfer container 10, the transfer container 10 may be tilted.

Due to such various factors, the transfer container 10 held and transferred by the OHT vehicle 100 may become a tilted state.

In a tilted state of the transfer container 10, the OHT vehicle 100 cannot accurately unload the transfer container 10 to the loading table of the load port of the destination port.

Figure 3:
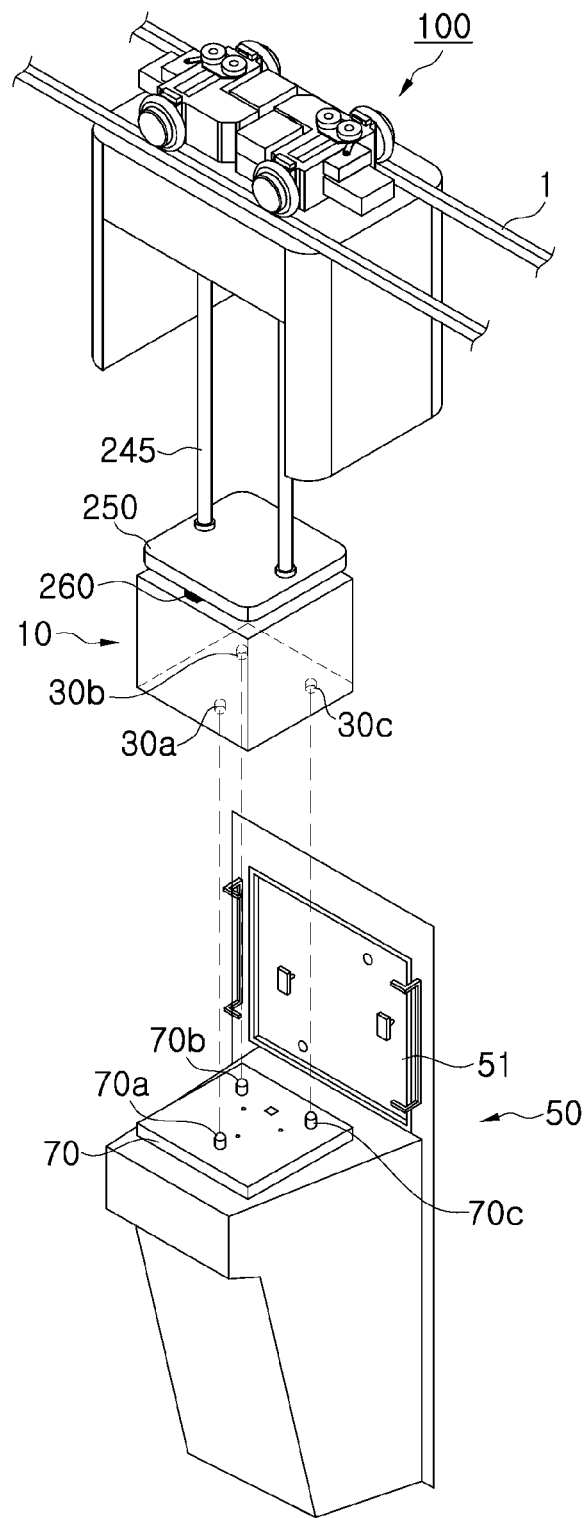
FIG. 3 is a view illustrating an example of transferring and unloading the transfer container to a destination port through the OHT vehicle.

In this regard, FIG. 3 illustrates an example of transferring and unloading the transfer container 10 to a destination port through OHT vehicle.

As an example, a load port 50 connected to substrate processing equipment, etc. may constitute a part of an equipment front end module (EFEM). The load port 50 is provided with a loading table 70 on which the transfer container 10 is placed. Positioning pins 70a, 70b, and 70c may be provided on the loading table 70 so as to determine an accurate position of the transfer container 10 unloaded by the OHT vehicle 100. As the positioning pins 70a, 70b, and 70c on the loading table 70, kinematic pins may be used.

When unloading the transfer container 10 on the loading table 70, the OHT vehicle 100 places the transfer container 10 so that the recesses 30a, 30b, and 30c formed in the lower surface of the transfer container 10 are correspondingly engaged with the positioning pins 70a, 70b, and 70c of the loading table 70.

As described above, the transfer container 10 has to be placed on the loading table 70 so that the recesses 30a, 30b, and 30c of the transfer container 10 correspond to the positioning pins 70a, 70b, and 70c of the loading table 70. This ensures that when the container door 13 of the transfer container 10 corresponds to a port door 51 of the load port 50 and the container door 13 and the port door 51 are opened, the inner space 17 of the transfer container 10 and the inner space of the substrate processing equipment connected to the load port 50 are connected to each other to maintain a sealed state from the outside.

However, as described above, the transfer container 10 held by the hoist module 200 of the OHT vehicle 100 may become a tilted state due to various factors. When the transfer container 10 is placed on the loading table 70 of the load port 50 in a state where the transfer container 10 is tilted, the recesses 30a, 30b, and 30c of the transfer container 10 cannot be properly engaged with the corresponding positioning pins 70a, 70b, and 70c of the loading table 70. In particular, when the container door 13 and the port door 51 are opened in a state where the transfer container 10 is not placed in a correct position on the loading table 70, the sealed state of the inner space of the substrate processing equipment is released, causing a problem that the overall semiconductor process cannot be performed properly.

In order to solve such a problem, the OHT vehicle 100 according to the present disclosure detects the degree of tilt of the transfer container 10 through a displacement measuring means 260 provided in the hand unit 250 and corrects the position of the transfer container 10, thereby enabling the transfer container 10 to be unloaded to the correct position on the loading table 70 of the load port 50.

As a more specific embodiment along with the embodiment of FIG. 1 with respect to the OHT vehicle 100 according to the present disclosure, the configuration of the hoist module 200 and the controller of the OHT vehicle 100 will be described with reference to FIGS. 4 to 6.

Figure 4A:
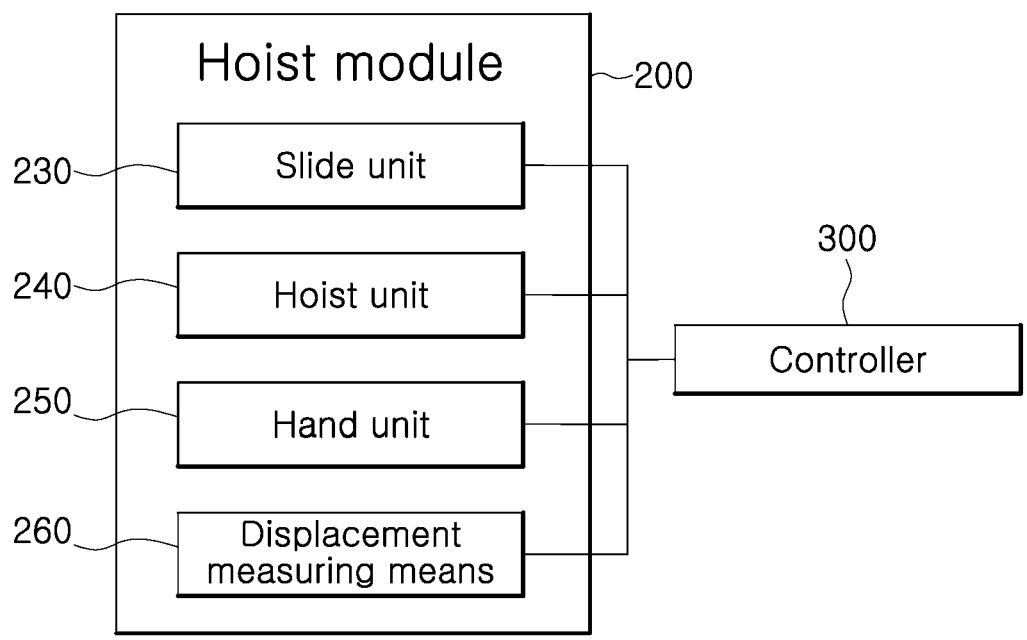
FIGS. 4A and 4B are block diagrams illustrating an embodiment of a hoist module and an embodiment of a controller of the OHT vehicle according to the present disclosure.
Figure 4B:
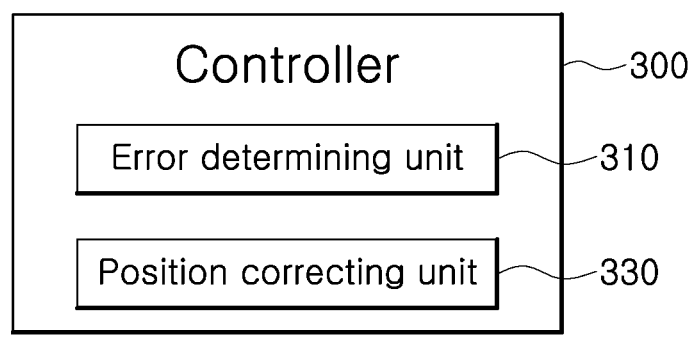
Figure 5:
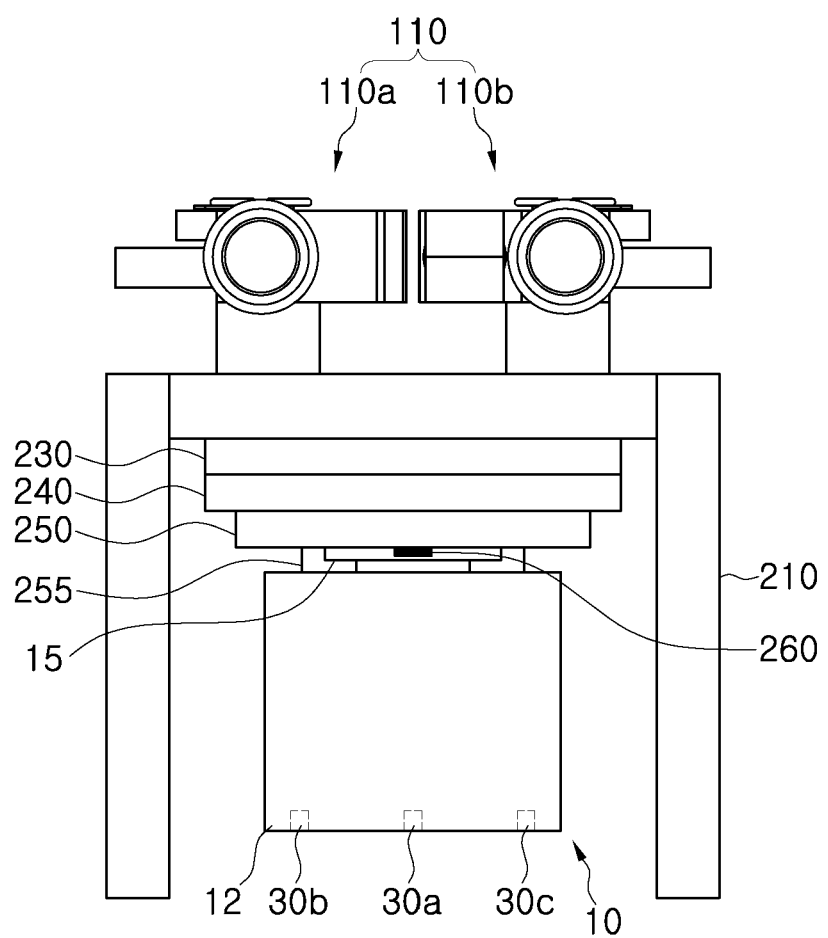
FIG. 5 is a side view illustrating an embodiment of an OHT vehicle according to the present disclosure.
Figure 6A:
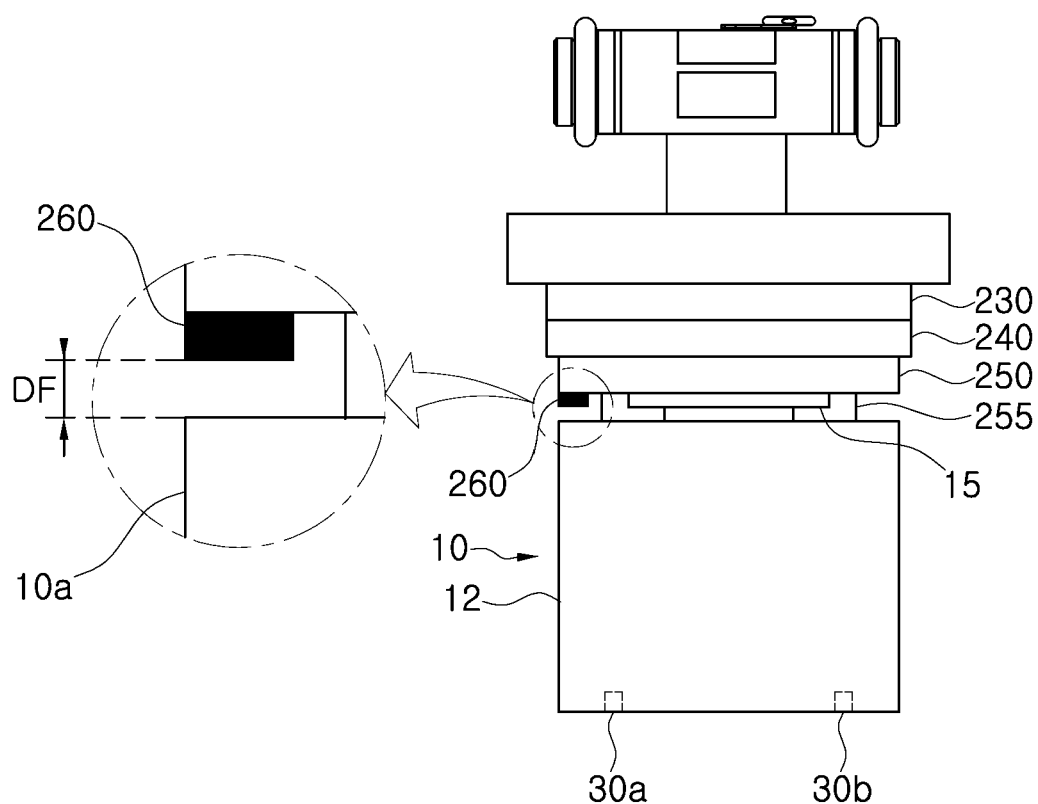
FIGS. 6A and 6B are front views illustrating the embodiment of the OHT vehicle according to the present disclosure in a state where a vehicle body is removed.
Figure 6B:
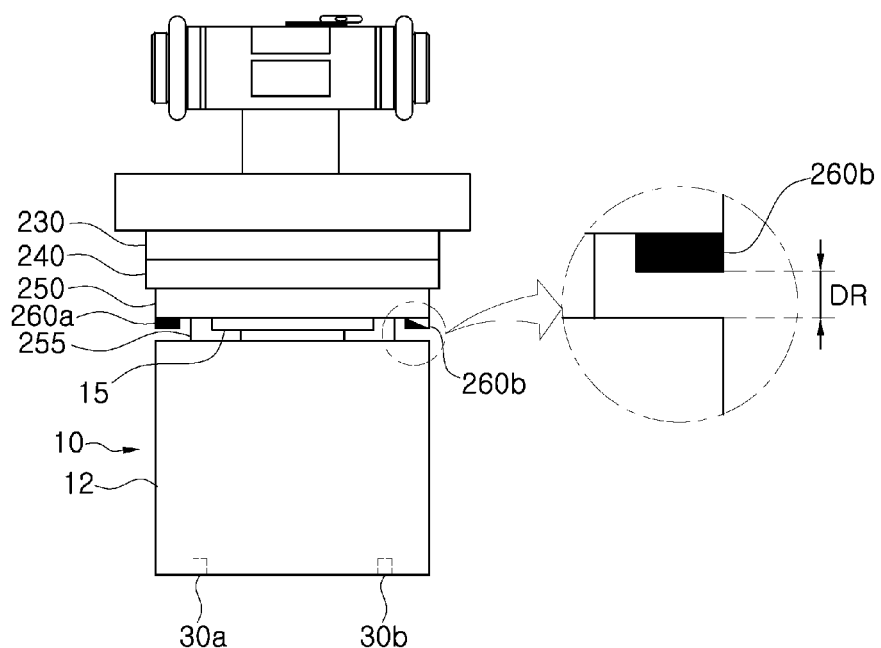

FIGS. 4A and 4B illustrate block diagrams of an embodiment of a hoist module 200 and an embodiment of a controller 300 of the OHT vehicle 100 according to the present disclosure. FIG. 5 illustrates a side view of an embodiment of an OHT vehicle 100 according to the present disclosure. FIGS. 6A and 6B 6 illustrate front views of the embodiment of the OHT vehicle 100 according to the present disclosure in a state where a vehicle body 210 is removed.

In the present embodiment, the controller 300 is illustrated and described as controlling only the hoist module 200, but this is for convenience of description of the present disclosure. The controller 300 may control various configurations included in the OHT vehicle 100 as well as the hoist module 200, and for this purpose may include additional control means for controlling each configuration.

The hoist module 200 may include the vehicle body 210, a slide unit 230, a hoist unit 240, a hand unit 250, and a displacement measuring means 260.

The vehicle body 210 may be positioned under a traveling module 110 and may be provided with an inner space in which a transfer container 10 is inserted and stored. The hoist unit 240 may be disposed at the top of the inner space of the vehicle body 210.

The hand unit 250 may hold and support the transfer container 10. For this purpose, the hand unit 250 may include a gripper 255 for holding a flange 15 of the transfer container 10 and a gripper driving means (not illustrated) for driving the gripper 255.

The hoist unit 240 may lift the hand unit 250. When loading the transfer container 10, the hoist unit 240 may lower the hand unit 250 to allow the hand unit 250 to hold the transfer container 10 and then may lift the hand unit 250. When unloading the transfer container 10, the hoist unit 240 may lower the hand unit 250 to allow the hand unit 250 to release and unload the transfer container 10 to a destination port.

For this purpose, the hoist unit 240 may include a lifting belt 245 and a belt driving means (not illustrated) for lifting and lowering the lifting belt 245. The number and arrangement position of the lifting belt 245 may be appropriately changed as needed.

The slide unit 230 may move the hoist unit 240 in a horizontal direction. As an example, the slide unit 230 may include a slide rail (not illustrated) for supportably moving the hoist unit 240 in the horizontal direction and a slide driving means (not illustrated).

The displacement measuring means 260 may measure a distance between the hand unit 250 and the transfer container 10 held by the hand unit 250. For this purpose, the displacement measuring means 260 may include a distance measuring sensor. As the distance measuring sensor, various sensors capable of measuring a distance, such as an optical sensor, a sound wave sensor, etc. may be used.

The sensor of the displacement measuring means 260 may be disposed on the hand unit 250, and may be disposed on an outer peripheral portion of a lower surface of the hand unit 250.

As an example, as illustrated in FIG. 6A, the displacement measuring means may include a front end distance measuring sensor 260 disposed at a front end of the hand unit 250, and may measure a distance DF between the front end of the hand unit 250 and a front end of the transfer container 10. Alternatively, the displacement measuring means may include a rear end distance measuring sensor disposed at a rear end of the hand unit 250, and may measure a distance DR between the rear end of the hand unit 250 and a rear end of the transfer container 10.

As an example, as illustrated in FIG. 6B, the displacement measuring means may include a front end distance measuring sensor 260*a* disposed at the front end of the hand unit 250 and a rear end distance measuring sensor 260*a* disposed at the rear end of the hand unit 250, and may measure both the distance DF between the front end of the hand unit 250 and the front end of the transfer container 10 and the distance DR between the rear end of the hand unit 250 and the rear end of the transfer container 10.

The controller 300 may control each configuration of the hoist module 200. In particular, the controller 300 may include an error determining part 310 and a position correcting part 330 and may adjust the position of the hand unit 250 by determining the degree of tilt of the gripped transfer container 10 on the basis of a distance value between the hand unit 250 and the transfer container 10 measured through the displacement measuring means 260.

For this purpose, the controller 300 may include the error determining part 310 and the position correcting part 330.

The error determining part 310 may calculate an error distance according to a recess position by determining the degree of tilt of the held transfer container 10 on the basis of the distance value between the hand unit 250 and the transfer container 10 and by determining the positions of recesses 30*a*, 30*b*, and 30*c* of the transfer container 10 on the basis of the degree of tilt of the transfer container 10.

In other words, in a case where the transfer container 10 is unloaded on a loading table of a load port in a tilted state, the error determining part 310 may calculate an error distance according to the degree of misalignment between positioning pins arranged on the loading table and the recesses 30*a*, 30*b*, and 30*c* of the transfer container 10.

As an example, in a case where the displacement measuring means 260 measures the distance between the front end of the hand unit 250 and the front end of the transfer container 10 to obtain a front end distance value or measures the distance between the rear end of the hand unit 250 and the rear end of the transfer container 10 to obtain a rear end distance value, the error determining part 310 may compare the front end distance value or the rear end distance value with a reference value to calculate a tilt angle, and may determine the positions of the recesses 30*a*, 30*b*, and 30*c* of the transfer container 10 on the basis of the tilt angle.

Here, the reference value may be set to be a distance between the hand unit 250 and the transfer container 10 in a normal state where the transfer container 10 is not tilted.

Furthermore, the error determining part 310 may calculate an error distance between a downward vertical extension line for the determined positions of the recesses 30*a*, 30*b*, and 30*c* and the positioning pins provided on the load port of the destination port and may calculate a correction distance on the basis of the error distance.

The position correcting part 330 may adjust the position of the hand unit 250 on the basis of the error distance calculated by the error determining part 310. As an example, the position correcting part 330 may control the slide unit 230 to horizontally move the position of the hand unit 250 by a distance corresponding to the correction distance calculated by the error determining part 310.

In addition, the controller 300 may correct the position of the hand unit 250 through the position correcting part 330 and then control the hoist unit 240 to lower the hand unit 250 and unload the transfer container 10 to the loading table of the load port so that the recesses 30*a*, 30*b*, and 30*c* of the transfer container 10 correspond to the positioning pins provided on the load port of the destination port.

The present disclosure also proposes a method of controlling the operation of an OHT vehicle according to the present disclosure, in which an error between a recess of a transfer container and a positioning pin of a load port caused by the tilt of the transfer container is resolved through position correction of a hand unit, thereby enabling the transfer container to be accurately placed on the load port. Hereinafter, the method of controlling the operation of the OHT vehicle according to the present disclosure will be described with reference to an embodiment. The method of controlling the operation of the OHT vehicle according to the present disclosure implemented in the above-described OHT vehicle according to the present disclosure, so the embodiment of the OHT vehicle according to the present disclosure will also be referred to hereinafter.

Figure 7:
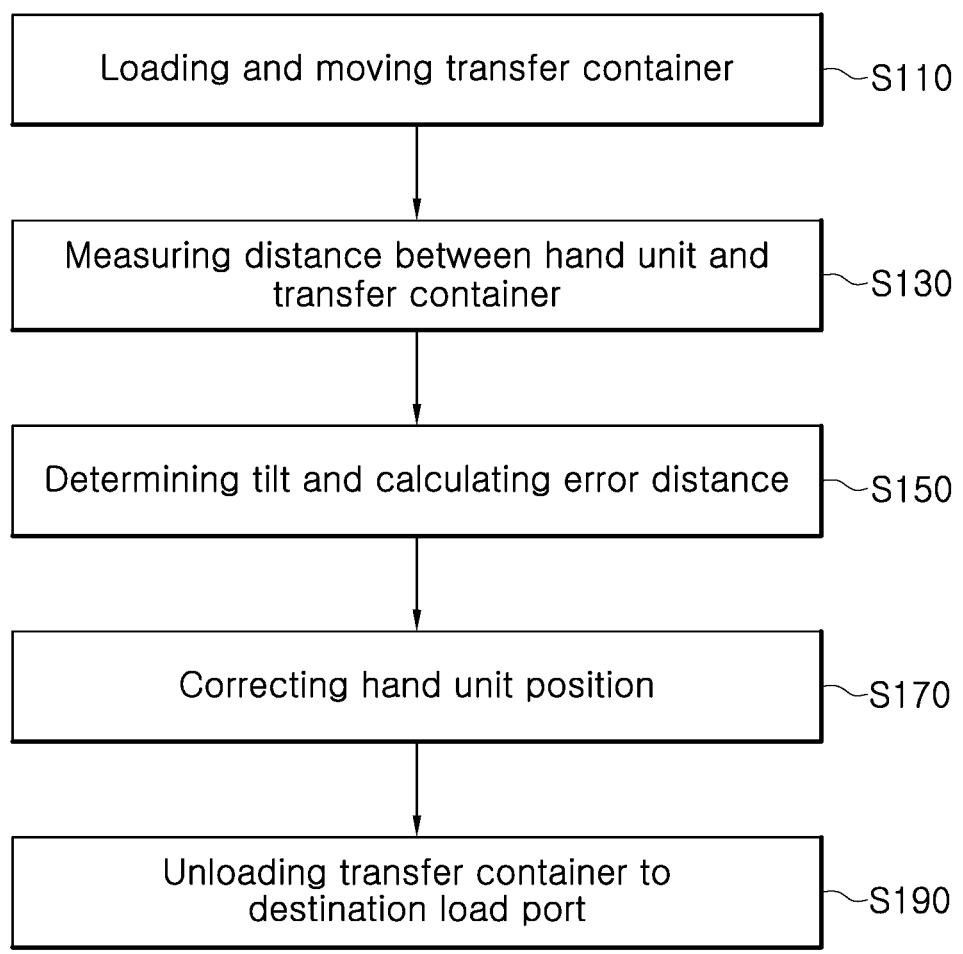
FIG. 7 is a flowchart illustrating an embodiment of a method of controlling the operation of an OHT vehicle according to the present disclosure.

FIG. 7 illustrates a flowchart of an embodiment of a method of controlling the operation of an OHT vehicle 100 according to the present disclosure.

The OHT vehicle 100 may load a transfer container 10 from a specific port and move the transfer container 10 to a destination port (S110).

In a case where the transfer container 10 is loaded from the specific port, or is being moved the destination port, or is arrived at the destination port, a distance between a hand unit 250 and the transfer container 10 may be measured S130 through displacement measuring means 260, 260a, and 260b (S130).

A controller 300 may determine the degree of tilt of the transfer container 10 held by the hand unit 250 on the basis of the distance value measured by the displacement measuring means 260, 260a, and 260b and my calculate an error distance of how far the recesses 30a, 30b, and 30c of the transfer container 10 are misaligned from normal positions thereof on the basis of the degree of tilt of the transfer container 10 (S150).

Then, the controller 300 may adjust and correct the position of the hand unit 250 by corresponding (i.e., moving) the transfer container 10 to a load port of the destination port where the transfer container 10 is to be unloaded on the basis of the degree of tilt of the transfer container 10 (S170). For example, the controller 300 may control a slide unit 230 on the basis of the calculated error distance to horizontally move the hand unit 250 to thereby adjust an unloading position of the transfer container 10.

When the unloading position of the transfer container 10 is adjusted through the position correction of the hand unit 250, the controller 300 may control a hoist unit 240 to lower the hand unit 250 and release a held state of the hand unit 250 to unload the transfer container 10 to the load port of the destination port (S190).

A more specific process for the method of controlling the operation of the OHT vehicle according to the present disclosure will be described with reference to an embodiment.

Figure 8:
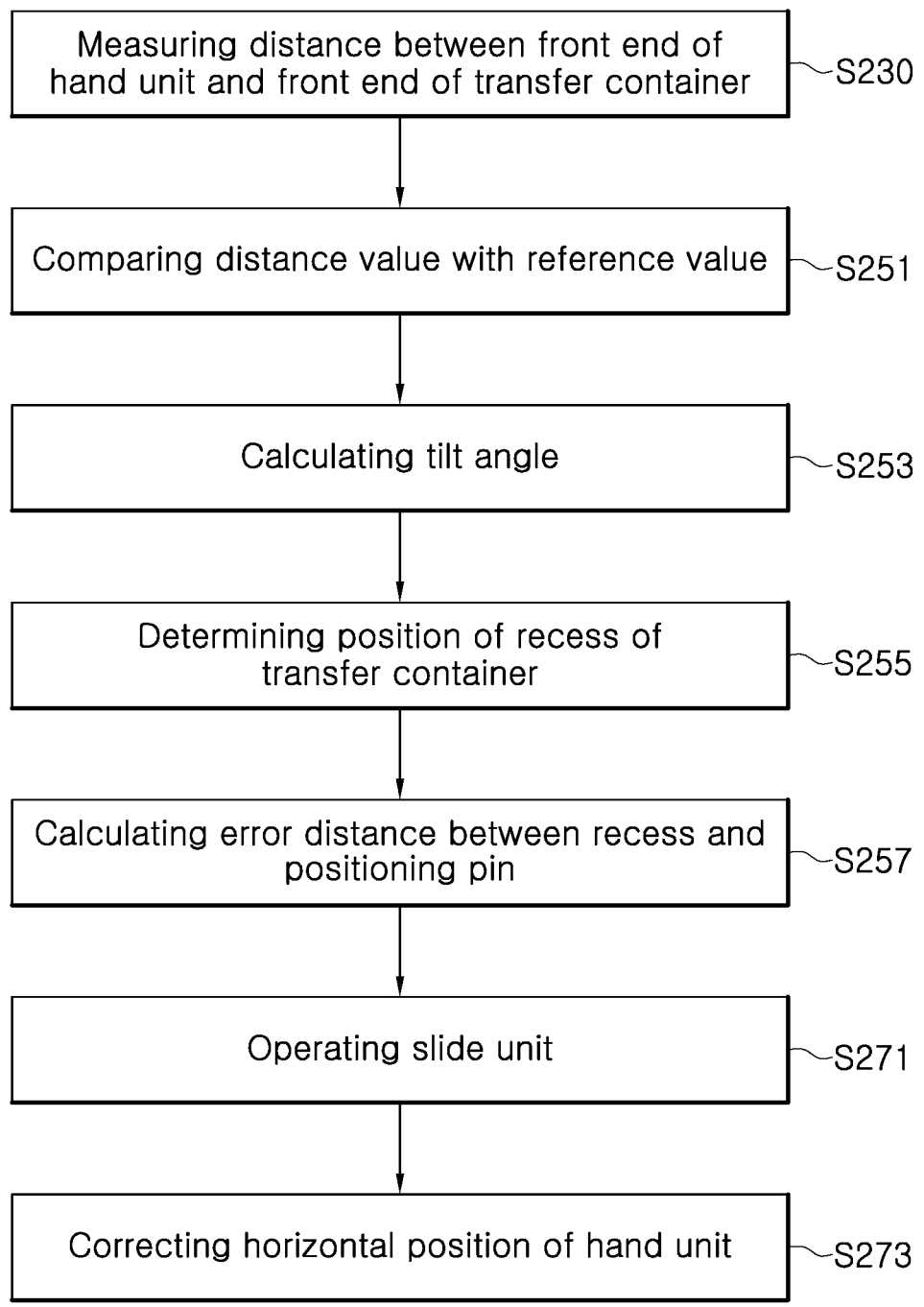
FIG. 8 is a flowchart illustrating a first embodiment of a process of position correction by determining the tilt of a transfer container in the method of controlling the operation of the OHT vehicle according to the present disclosure.
Figure 9:
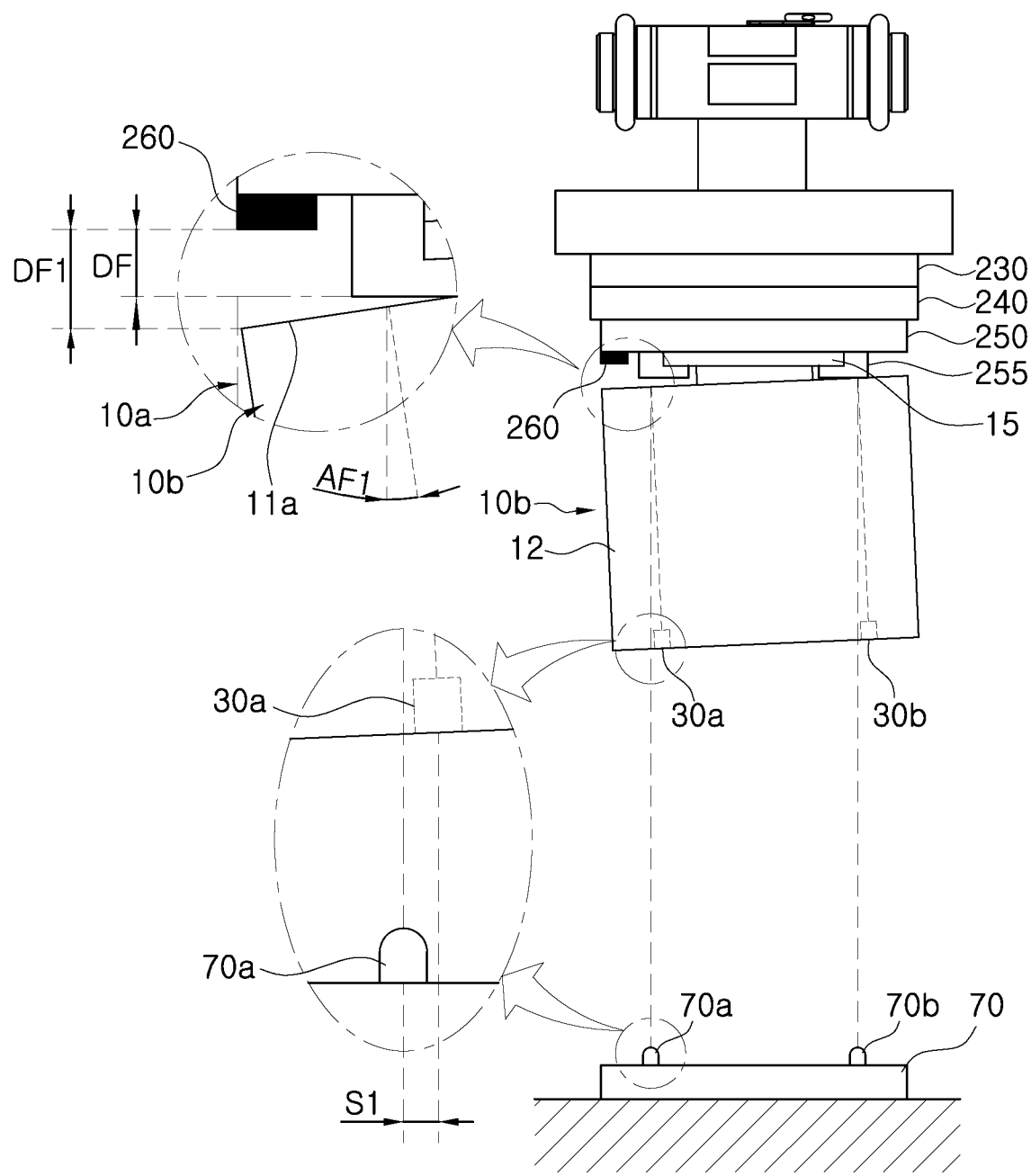
FIGS. 9 to 11 are views illustrating an example of unloading the transfer container through position correction according to the first embodiment of the method of controlling the operation of the OHT vehicle according to the present disclosure.
Figure 10:
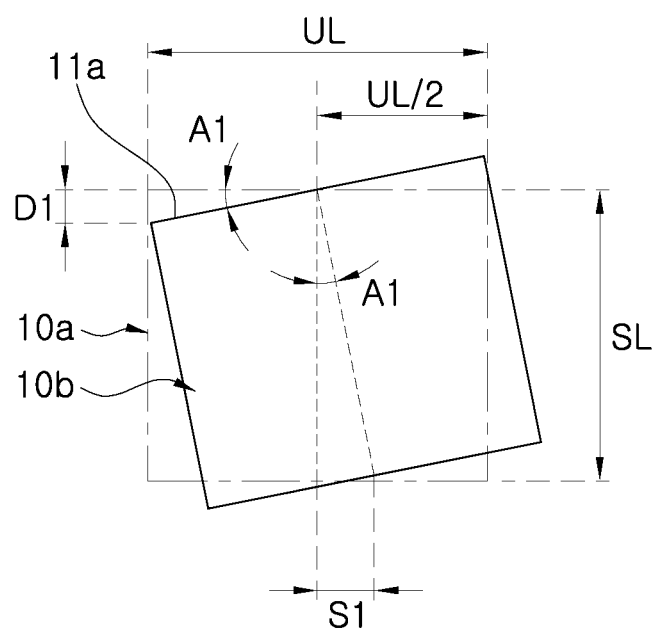
Figure 11:
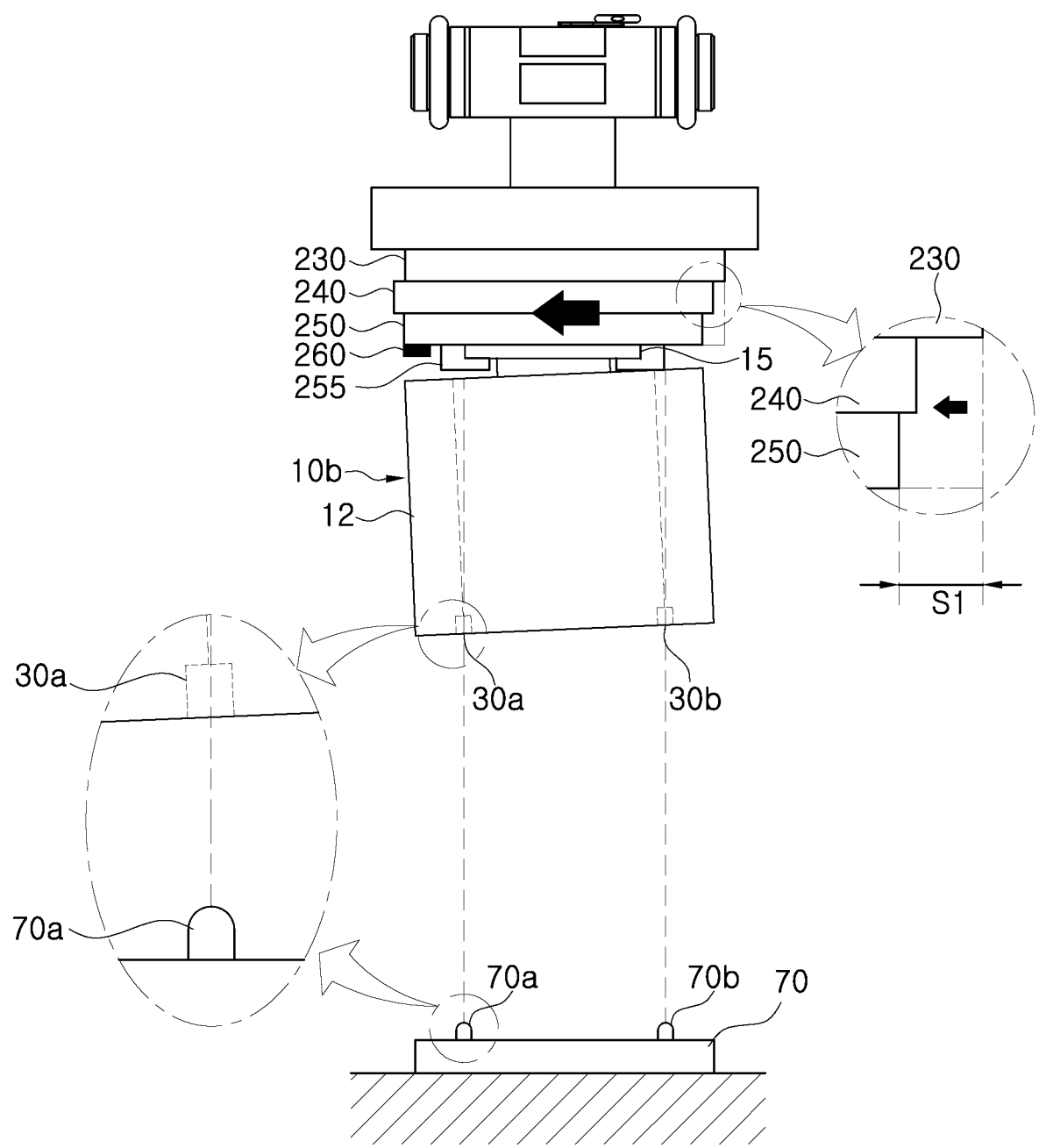

FIG. 8 illustrates a flowchart of a first embodiment of a process of position correction by determining the tilt of a transfer container 10 in the method of controlling the operation of the OHT vehicle 100 according to the present disclosure. FIGS. 9 to 11 illustrate an example of unloading the transfer container 10 through position correction according to the first embodiment of the method of controlling the operation of the OHT vehicle 100 according to the present disclosure.

The present embodiment illustrates a process of position correction by determining the tilt of the transfer container 10 in a case where a distance measuring sensor 260 of a displacement measuring means is disposed at a front end of a hand unit 250.

A distance DF1 between the front end of the hand unit 250 and a front end of the transfer container 10 may be measured through a front end distance measuring sensor 260 disposed at the front end of the hand unit 250 (S230).

In a case where the transfer container 10 held by the hand unit 250 is tilted, a difference occurs between a front end distance value DF1 measured through the front end distance measuring sensor 260 and a distance DF between the front end of the hand unit 250 and the front end of the transfer container 10, the distance DF being measured in a normal state of the transfer container 10.

The controller 300 may compare the front end distance value DF1 with a reference value (S251) to determine the degree of tilt of the transfer container 10 held by the hand unit 250. Here, the reference value may be set to be the normal state distance DF.

The controller 300 may calculate a tilt angle AF1, i.e., the degree of tilt of the transfer container 10, according to the ratio between the front end distance value DF1 and the reference value DF (S253), and may determine the positions of recesses 30a and 30b of the transfer container 10 on the basis of the tilt angle AF1 (S255). Then, the controller 300 may calculate an error distance S1 between the positions of the recesses 30a and 30b of the transfer container 10 and normal positions thereof on the basis of the tilt angle AF1 (S257).

Referring to a conceptual diagram illustrated in FIG. 10, the transfer container 10 may obtain information about a width length UL and a height SL of the transfer container 10 in advance according to the SEMI standard or according to the size setting during the manufacture of the transfer container 10.

A vertical distance error D1 corresponding to the degree of tilt of a transfer container 10b in a tilted state with respect to a transfer container 10a in a normal state may be calculated by comparing the front end distance value DF1 and the normal state distance DF. For example, the vertical distance error D1 may be calculated by subtracting the normal state distance DF from the front end distance value DF1.

A horizontal tilt angle A1 may be calculated on the basis of the width length UL and the vertical distance error D1. For example, the tilt angle A1 may be calculated through the following [Equation 1] below.

$$\text{Sin } A1 = \frac{D1}{\left(\frac{UL}{2}\right)} \quad \text{[Equation 1]}$$

The tilt angle in the vertical direction corresponds to the tilt angle in the horizontal direction, so a vertical tilt angle A1 may be determined.

By determining the vertical tilt angle A1, the recesses 30a and 30b of the transfer container 10 may be determined to be located in a position that is misaligned by the vertical tilt angle A1.

In addition, the error distance S1 between the positions of the recesses 30a and 30b of the transfer container 10 and the normal positions thereof may be calculated through the following [Equation 2] below.

$$S1 = SL \times \arctan A1 \quad \text{[Equation 2]}$$

Here, as illustrated in FIG. 9, the calculated error distance S1 may be an error distance S1 between a vertical downward extension line for the positions of the recesses 30a and 30b and positioning pins 70a and 70b provided on a loading table 70 of a load port of a destination port.

Through such a process, the error distance S1 between the recesses 30a and 30b of the transfer container 10 and the positioning pins 70a and 70b of the loading table 70 may be determined.

In addition, to resolve the error between the recesses 30a and 30b of the transfer container 10 and the positioning pins 70a and 70b provided on the loading table 70 of the load port, a correction distance for moving the hand unit 250 may be calculated.

In the present embodiment, the correction distance for moving the hand unit 250 may correspond to the calculated error distance S1.

Then, as illustrated in FIG. 11, the controller 300 may control the operation of a slide unit 230 (S271) to move the hand unit 250 in the horizontal direction by the correction distance S1 to thereby correct the position of the transfer container 10 (S273).

As a result of correcting the position of the hand unit 250, the recesses 30a and 30b of the transfer container 10 may be positioned on a vertical line to be accurately aligned with the positioning pins 70a and 70b provided on the loading table 70 of the load port.

The controller 300 may lower the hand unit 250 through the hoist unit 240 in a state where the position of the transfer container 10 is corrected and unload the transfer container 10 so that the recesses 30a and 30b of the transfer container 10 are accurately engaged with the corresponding positioning pin 70a and 70b provided on the loading table 70 of the load port.

In the previous embodiment, position correction was performed by determining the degree of tilt on the basis of the distance between the front end of the hand unit 250 and the front end of the transfer container 10 through the distance measuring sensor 260 disposed at the front end of the hand unit 250. However, the present embodiment may be applied even to a case where a distance measuring sensor is disposed at a rear end of the hand unit 250, and position correction is performed by determining the degree of tilt on the basis of the distance between the rear end of the hand unit 250 and a rear end of the transfer container 10.

Figure 12:
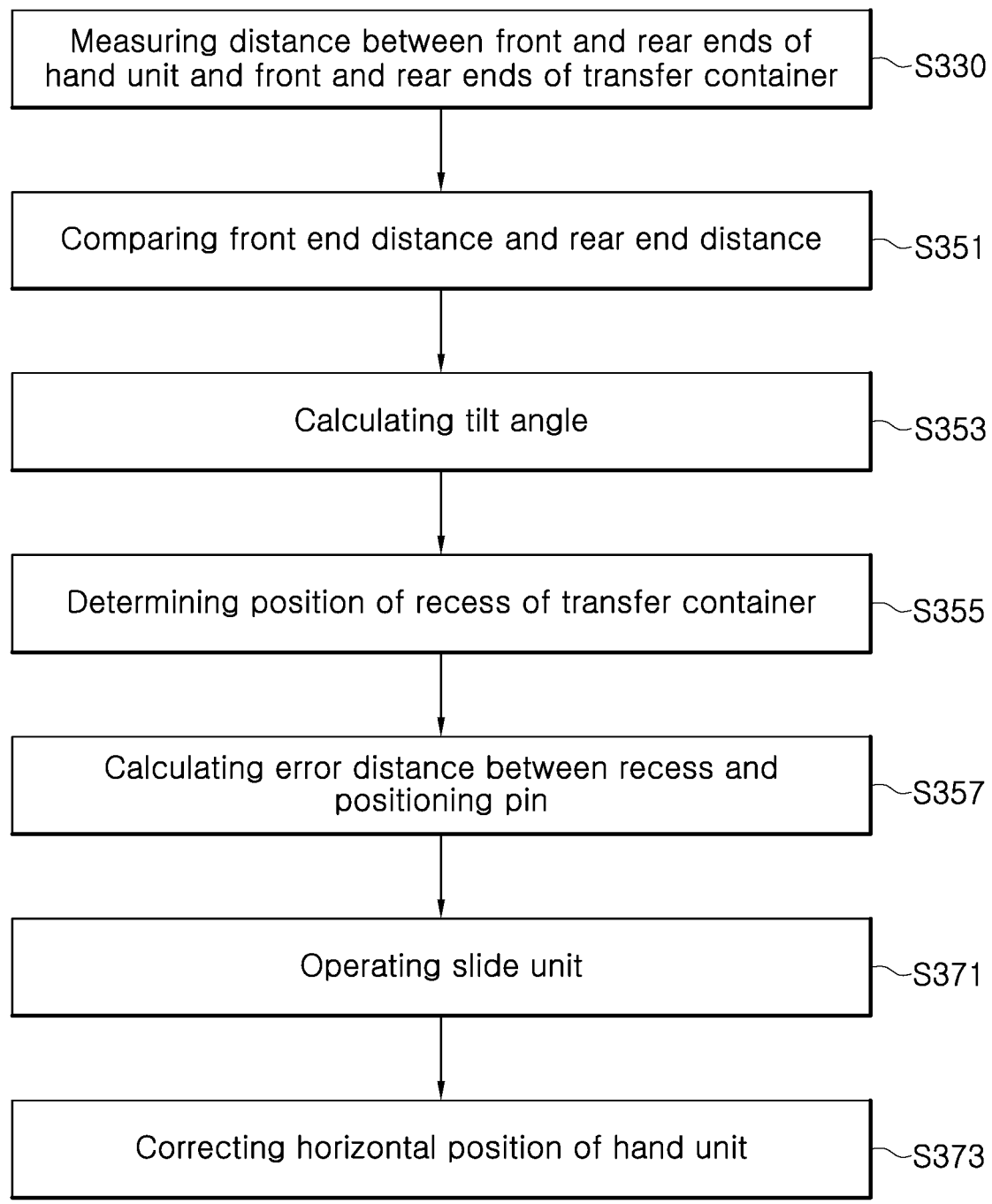
FIG. 12 is a flowchart illustrating a second embodiment of a process of position correction by determining the tilt of a transfer container in the method of controlling the operation of the OHT vehicle according to the present disclosure.

FIG. 12 illustrates a flowchart of a second embodiment of a process of position correction by determining the tilt of a transfer container 10 in the method of controlling the operation of the OHT vehicle 100 according to the present disclosure. FIGS. 13 to 16 illustrate an example of unloading the transfer container 10 through position correction according to the second embodiment of the method of controlling the operation of the OHT vehicle 100 according to the present disclosure.

The present embodiment illustrates a process of position correction by determining the degree of tilt of the transfer container 10 on the basis of a front end distance and a rear end distance measured through a front end distance measuring sensor 260a disposed at a front end of a hand unit 250 and a rear end distance measuring sensor 260b disposed at a rear end of the hand unit 250.

A distance DF21 between the front end of the hand unit 250 and a front end of the transfer container 10 may be measured through the front end distance measuring sensor 260a disposed at the front end of the hand unit 250 (S330). A distance DF22 between the rear end of the hand unit 250 and a rear end of the transfer container 10 may be measured through the rear end distance measuring sensor 260b disposed at the rear end of the hand unit 250 (S330).

Figure 13:
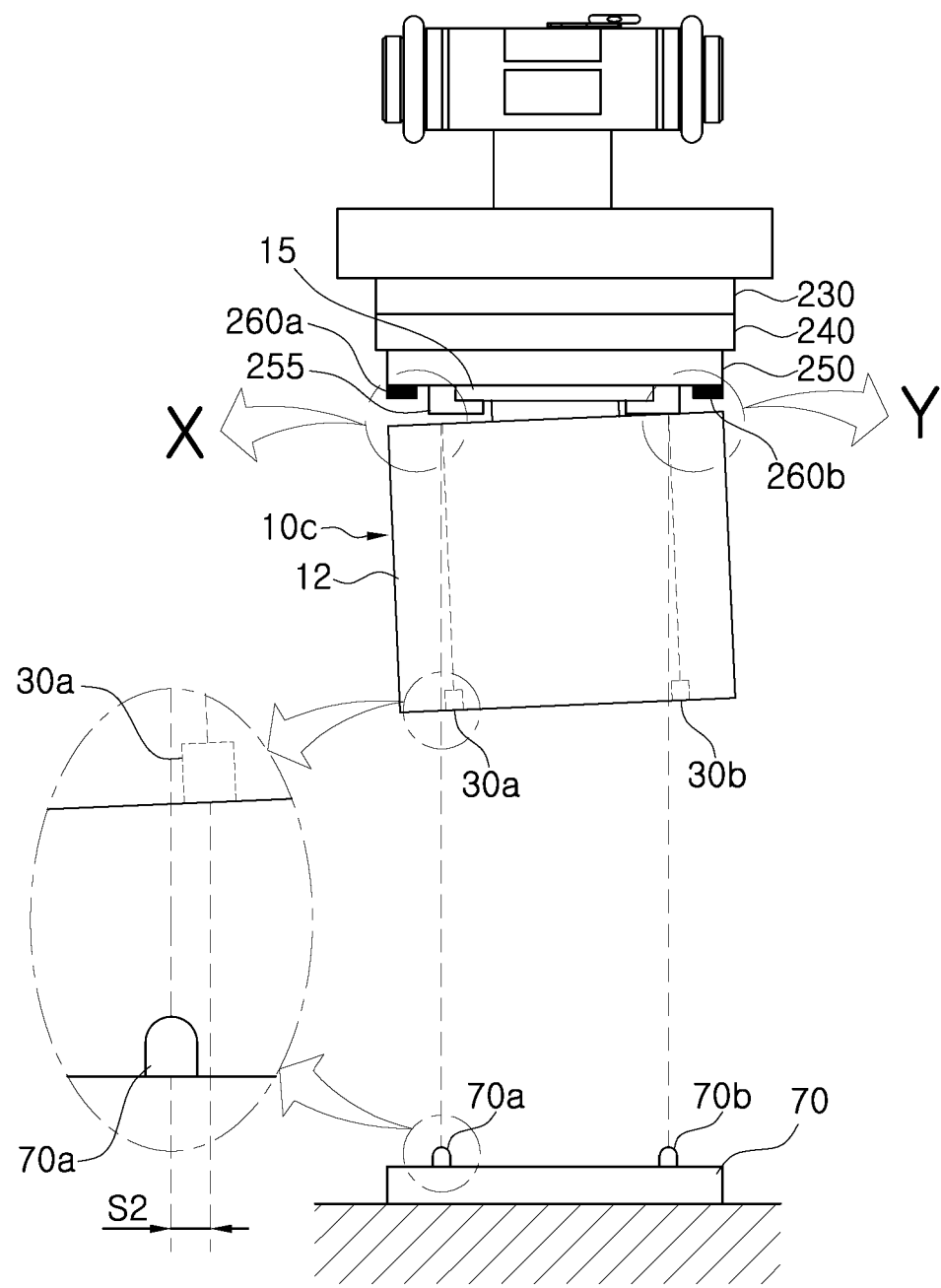
FIGS. 13 to 16 are views illustrating an example of unloading the transfer container through position correction according to the second embodiment of the method of controlling the operation of the OHT vehicle according to the present disclosure.
Figure 14:
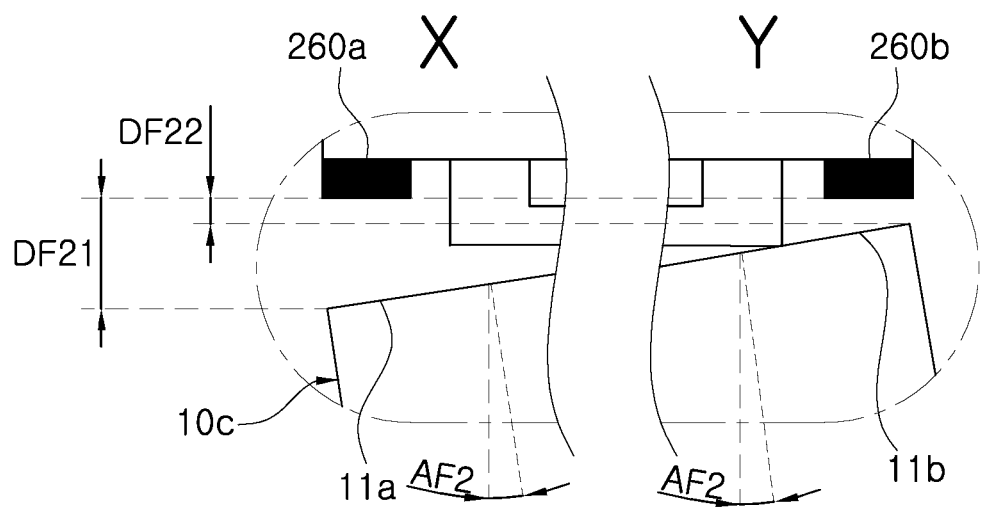

Referring to FIG. 14, which is an enlarged view of the sections X and Y illustrated in FIG. 13, in a case where the transfer container 10 held by the hand unit 250 is tilted, a difference occurs between a front end distance value DF21 measured through the front end distance measuring sensor 260a and a rear end distance value DF22 measured through the rear end distance measuring sensor 260b.

A controller 300 may compare the front end distance value DF21 with the rear end distance value DF22 (S351) to determine the degree of tilt of the transfer container 10 held by the hand unit 250.

The controller 300 may calculate a tilt angle AF2, i.e., the degree of tilt of the transfer container 10, according to the ratio between the front end distance value DF21 and the rear end distance value DF22 (S353), and may determine the positions of recesses 30a and 30b of the transfer container 10 on the basis of the tilt angle AF2 (S355). Then, the controller 300 may calculate an error distance S2 between the positions of the recesses 30a and 30b of the transfer container 10 and normal positions thereof on the basis of the tilt angle AF2 (S357).

Figure 15:
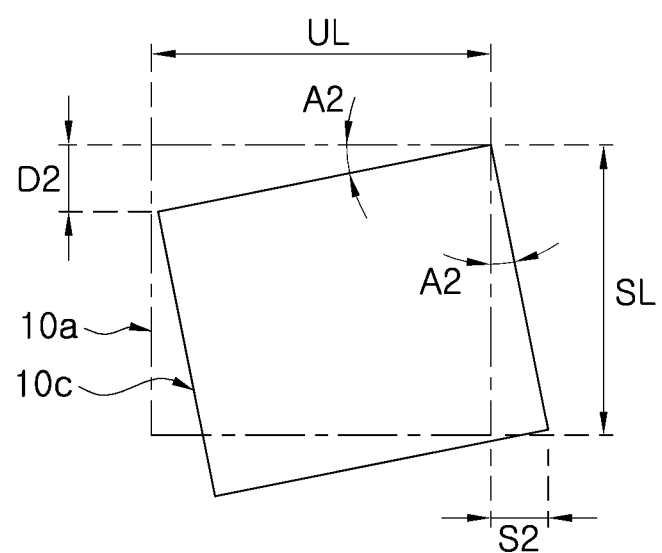

Referring to a conceptual diagram illustrated in FIG. 15, the transfer container 10 may obtain information about a width length UL and a height SL of the transfer container 10 in advance according to the SEMI standard or according to the size setting during the manufacture of the transfer container 10.

A vertical distance error D2 corresponding to the degree of tilt of a transfer container 10b in a tilted state with respect to a transfer container 10a in a normal state may be calculated by comparing the front end distance value DF21 and the rear end distance value DF22. For example, the vertical distance error D2 may be calculated by subtracting the rear end distance value DF22 from the front end distance value DF21.

A horizontal tilt angle A2 may be calculated on the basis of the width length UL and the vertical distance error D2. For example, the tilt angle A2 may be calculated through the following [Equation 3] below.

$$\sin A2 = \frac{D2}{UL} \qquad \text{[Equation 3]}$$

The tilt angle in the vertical direction corresponds to the tilt angle in the horizontal direction, so a vertical tilt angle A2 may be determined.

By determining the vertical tilt angle A2, the recesses 30a and 30b of the transfer container 10 may be determined to be located in a position that is misaligned by the vertical tilt angle A2.

In addition, the error distance S2 between the positions of the recesses 30a and 30b of the transfer container 10 and the normal positions thereof may be calculated through the following [Equation 4] below.

$$S2 = SL \times \arctan A2 \qquad \text{[Equation 4]}$$

Here, as illustrated in FIG. 13, the calculated error distance S2 may be an error distance S2 between a vertical downward extension line for the positions of the recesses 30a and 30b and positioning pins 70a and 70b provided on a loading table 70 of a load port of a destination port.

Through such a process, the error distance S2 between the recesses 30a and 30b of the transfer container 10 and the positioning pins 70a and 70b of the loading table 70 may be determined.

In addition, to resolve the error between the recesses 30a and 30b of the transfer container 10 and the positioning pins 70a and 70b provided on the loading table 70 of the load port, a correction distance for moving the hand unit 250 may be calculated.

In the present embodiment, the correction distance for moving the hand unit 250 may correspond to the calculated error distance S2. In an embodiment, the error distance S2 between the positions of the recesses 30a and 30b of the transfer container 10 and the normal positions thereof may be calculated through the [Equation 4] as the correction distance.

Figure 16:
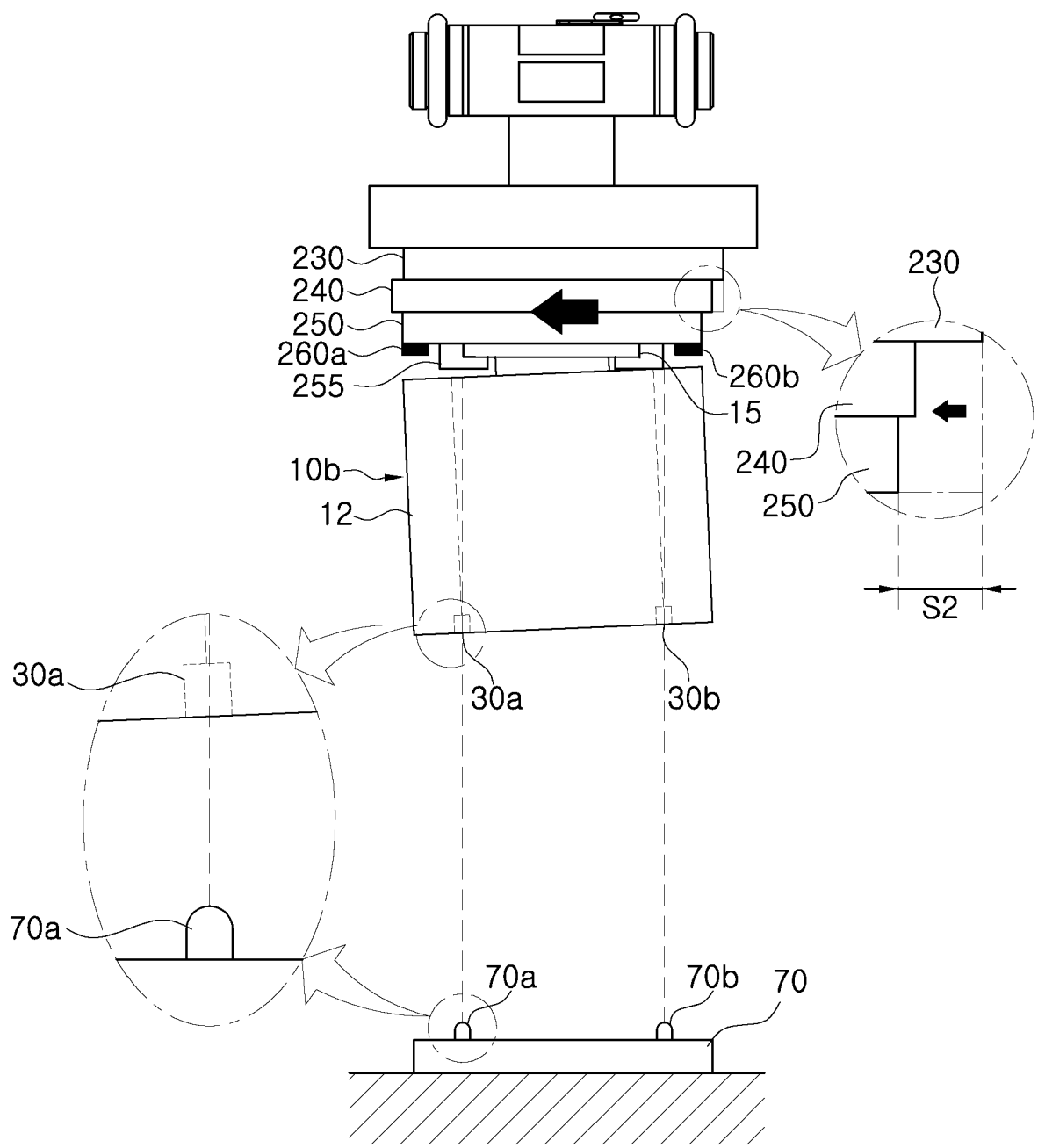

Then, as illustrated in FIG. 16, the controller 300 may control the operation of a slide unit 230 (S371) to move the hand unit 250 in the horizontal direction by the correction distance S2 to thereby correct the position of the transfer container 10 (S373).

As a result of correcting the position of the hand unit 250, the recesses 30a and 30b of the transfer container 10 may be positioned on a vertical line to be accurately aligned with the positioning pins 70a and 70b provided on the loading table 70 of the load port.

The controller 300 may lower the hand unit 250 through the hoist unit 240 in a state where the position of the transfer container 10 is corrected and unload the transfer container 10 so that the recesses 30a and 30b of the transfer container 10 are accurately engaged with the corresponding positioning pin 70a and 70b provided on the loading table 70 of the load port.

According to the present disclosure as described above, it is possible to accurately place the transfer container on the loading table of the load port by determining the degree of tilt of the transfer container transferred by the OHT vehicle and correcting the unloading position of the transfer container.

In particular, it is possible to solve various problems that occur when the transfer container cannot be unloaded to an accurate position on the loading table of the load port.

While the exemplary embodiments of the disclosure have been described above, those skilled in the art will appreciate that various modifications, additions, and substitutions are possible, without departing from the scope and spirit of the disclosure. Therefore, the embodiments disclosed in this specification are only for illustrative purposes rather than limiting the technical spirit of the present disclosure. The scope of the present disclosure should be defined only by the accompanying claims and equivalents thereof.

What is claimed is:

1. A method of controlling operation of an overhead hoist transfer (OHT) vehicle, the method comprising:
   a transferring step of loading a transfer container and moving the transfer container to a destination port;
   an error determining step of measuring a distance value between a hand unit and the transfer container and determining a degree of tilt of the transfer container on the basis of the distance value;
   a position correcting step of adjusting a position of the hand unit by moving the transfer container to a load port of the destination port where the transfer container is to be unloaded on the basis of the degree of tilt of the transfer container; and
   an unloading step of unloading the transfer container to the load port of the destination port.

2. The method of claim 1,
   wherein the position correcting step is performed by moving the transfer container to the load port of the destination port where the transfer container is to be unloaded on the basis of the degree of tilt of the transfer container and moving the hand unit through a slide unit.

3. The method of claim 1,
   wherein the error determining step comprises:
   a distance measuring step of measuring a front end distance value between a front end of the hand unit and a front end of the transfer container; and
   a tilt determining step of determining the degree of tilt by comparing the front end distance value with a reference value.

4. The method of claim 3,
   wherein the tilt determining step is performed by calculating a tilt angle according to a ratio between the front end distance value and the reference value.

5. The method of claim 1,
   wherein the error determining step comprises:
   a distance measuring step of measuring a rear end distance value between a rear end of the hand unit and a rear end of the transfer container; and
   a tilt determining step of determining the degree of tilt by comparing the rear end distance value with a reference value.

6. The method of claim 5,
   wherein the tilt determining step is performed by calculating a tilt angle according to a ratio between the rear end distance value and the reference value.

7. The method of claim 1,
   wherein the error determining step comprises:
   a distance measuring step of measuring a front end distance value between a front end of the hand unit and a front end of the transfer container and a rear end distance value between a rear end of the hand unit and a rear end of the transfer container; and
   a tilt determining step of determining the degree of tilt by comparing the front end distance value with the rear end distance value.

8. The method of claim 1,
   wherein the error determining step comprises:
   a recess position determining step of determining a position of a recess of the transfer container on the basis of the degree of tilt of the transfer container; and
   an error distance calculating step of calculating an error distance between the determined position of the recess and a normal position of the recess.

9. The method of claim 7,
   wherein the tilt determining step is performed by calculating a tilt angle according to a ratio between the front end distance value and the rear end distance value.

10. The method of claim 9,
    wherein the error distance calculating step is performed by calculating an error distance between a downward vertical extension line for the determined position of the recess and a positioning pin provided on the load port of the destination port as a correction distance.

11. The method of claim 10,
    wherein the position correcting step is performed by horizontally moving the hand unit by the correction distance through a slide unit.

12. An OHT vehicle comprising:
    a transfer module configured to be movable along a rail;
    a hoist module comprising:
      a hand unit configured to hold a transfer container,
      a hoist unit configured to move the hand unit in a vertical direction, and
      a slide unit configured to move the hand unit in a horizontal direction;
    a displacement measuring means mounted on the hand unit and configured to measure a distance value between the hand unit and the transfer container held by the hand unit; and
    a controller configured to adjust a position of the hand unit by determining a degree of tilt of the held transfer container on the basis of the distance value between the hand unit and the transfer container.

13. The OHT vehicle of claim 12,
    wherein the displacement measuring means comprises a distance measuring sensor disposed at one of a front end of the hand unit and a rear end of the hand unit and configured to measure a distance value between one of the front end of the hand unit and the rear end of the hand unit and a corresponding one of a front end of the transfer container and a rear end of the transfer container.

14. The OHT vehicle of claim 12,
wherein the displacement measuring means comprises:
a front end distance measuring sensor disposed at a front end of the hand unit and configured to measure a distance value between the front end of the hand unit and a front end of the transfer container; and
a rear end distance measuring sensor disposed at a rear end of the hand unit and configured to measure a distance value between the rear end of the hand unit and a rear end of the transfer container.

15. The OHT vehicle of claim 12,
wherein the controller comprises:
an error determining part configured to calculate an error distance according to a recess position by determining the degree of tilt of the held transfer container on the basis of the distance value between the hand unit and the transfer container and by determining a position of a recess of the transfer container on the basis of the degree of tilt of the transfer container; and
a position correcting part configured to adjust the position of the hand unit on the basis of the error distance.

16. The OHT vehicle of claim 15,
wherein the error determining part calculates a tilt angle by comparing a front end distance value between a front end of the hand unit and a front end of the transfer container or a rear end distance value between a rear end of the hand unit and a rear end of the transfer container with a reference value, and determines the position of the recess of the transfer container on the basis of the tilt angle.

17. The OHT vehicle of claim 16,
wherein the error determining part calculates an error distance between a downward vertical extension line for the determined position of the recess and a positioning pin provided on a load port of a destination port as a correction distance.

18. The OHT vehicle of claim 17,
wherein the position correcting part controls the slide unit to horizontally move the hand unit by the correction distance.

19. The OHT vehicle of claim 18,
wherein the controller corrects the position of the hand unit through the position correcting part and then controls the hoist unit to lower the hand unit and unload the transfer container so that the recess of the transfer container corresponds to a positioning pin provided on a load port of a destination port.

20. A method of controlling operation of an OHT vehicle, the method comprising:
a transferring step of loading a transfer container and moving the transfer container to a destination port;
a distance measuring step of measuring a distance value between at least one of a front end and a rear end of a hand unit and at least one of a front end and a rear end of the transfer container;
a tilt determining step of calculating a tilt angle according to a degree of tilt of the transfer container by comparing a front end distance value or a rear end distance value with a reference value or by comparing the front end distance value with the rear end distance value;
a recess position determining step of determining a position of a recess of the transfer container on the basis of the degree of tilt;
an error distance calculating step of calculating an error distance between a downward vertical extension line for the determined position of the recess and a positioning pin provided on a load port of the destination port as a correction distance;
a position correcting step of horizontally moving the hand unit by the correction distance through a slide unit; and
an unloading step of lowering the hand unit through a hoist unit and unloading the transfer container to the load port of the destination port.

\* \* \* \* \*